(12) United States Patent
Maleville et al.

(10) Patent No.: US 7,138,325 B2
(45) Date of Patent: Nov. 21, 2006

(54) METHOD OF MANUFACTURING A WAFER

(75) Inventors: Christophe Maleville, La Terrasse (FR); Emmanuel Aréne, Biviers (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 91 days.

(21) Appl. No.: 11/004,410

(22) Filed: Dec. 3, 2004

(65) Prior Publication Data
US 2005/0277278 A1    Dec. 15, 2005

(30) Foreign Application Priority Data
Jun. 11, 2004   (EP) ................... 04291473

(51) Int. Cl.
*H01L 21/44* (2006.01)
(52) U.S. Cl. .......................... 438/607; 117/2
(58) Field of Classification Search ................ 438/607, 438/622, 689, 690, 692, 709; 117/2, 84, 117/89
See application file for complete search history.

(56) References Cited

U.S. PATENT DOCUMENTS

| | | | |
|---|---|---|---|
| 5,639,299 A | 6/1997 | Inoue et al. .................. 117/2 |
| 6,039,803 A * | 3/2000 | Fitzgerald et al. ............ 117/89 |
| 6,174,727 B1 * | 1/2001 | Homma et al. ................ 436/5 |
| 6,488,767 B1 * | 12/2002 | Xu et al. ........................ 117/2 |
| 6,995,427 B1 * | 2/2006 | Aulnette et al. ............ 257/345 |
| 2002/0069816 A1 | 6/2002 | Gehrke et al. ................ 117/84 |
| 2004/0115941 A1 | 6/2004 | Siebert et al. ............. 438/689 |
| 2005/0066886 A1 * | 3/2005 | Akatsu et al. ................ 117/84 |
| 2005/0188915 A1 * | 9/2005 | Bourdelle et al. ............. 117/2 |

FOREIGN PATENT DOCUMENTS

| | | |
|---|---|---|
| DE | 19960823 | 7/2001 |
| EP | 0 711 854 A1 | 5/1996 |
| EP | 1 156 531 A1 | 11/2001 |
| FR | 2 246 067 | 4/1975 |
| JP | 10172976 | 6/1998 |

* cited by examiner

*Primary Examiner*—Phuc T. Dang
(74) *Attorney, Agent, or Firm*—Winston & Strawn LLP

(57) ABSTRACT

The present invention relates to a method of manufacturing a semiconductor wafer that includes providing a substrate of a single crystalline first material that has an unfinished or rough surface, and epitaxially growing at least one layer of a second material directly on the unfinished or rough surface of the first material. The second material has a lattice that is different from that of the first material and the epitaxial growing of the second material is advantageously performed before a final surface finishing step on the unfinished or rough surface of the substrate to increase bonding between the materials.

22 Claims, 4 Drawing Sheets

METHOD OF MANUFACTURING A WAFER

FIELD OF THE INVENTION

The invention relates to methods for manufacturing semiconductor wafers that include layers of different materials.

BACKGROUND OF THE INVENTION

Heteroepitaxial layers such as silicon germanium ("SiGe") layers grown on single crystalline substrates such as silicon enjoy an increasing popularity for manifold applications in semiconductor technology. However, due to the difference in lattice between the substrate and the heteroepitaxially grown layer, misfit and associated threading dislocations are formed during growth of the heteroepitaxial layer.

One approach to producing defect-free heteroepitaxial layers is the growth of a graded buffer layer of SiGe on a silicon substrate where the germanium percentage of the SiGe layer is gradually increased starting from the substrate. The increase in germanium concentration can reach 100% germanium at the surface of the graded buffer layer. Grading up of a heteroepitaxial layer stack, however, results in a high degree of surface roughness and waviness of the resulting structures. In particular, the surface of such a structure is highly degraded by the so-called "cross-hatch" phenomenon caused by a stress release during growth of the heteroepitaxial SiGe layer.

Since a controlled surface nanotopography and low roughness are key issues in utilizing heteroepitaxial structures for integrated circuits, the rough and wavy surface of the heteroepitaxial SiGe layer must be planarized to remove surface nanotopography, and must be further polished by a chemical-mechanical polishing ("CMP") step to perfect surface roughness by keeping surface nanotopography at the same level. It is very difficult to balance the effects of planarization and polishing since geometry and surface nanotopography properties of the structure will be degraded by polishing.

U.S. Pat. No. 6,039,803 shows a method for improvement in the surface roughness and reduction of the dislocation pile-up density of a heteroepitaxial layer by growing such a layer on a miscut silicon substrate. The miscut substrate has a crystallographic orientation off-cut to an orientation from about 1° to about 8° offset from the [001] direction. Such miscut substrates, however, are not commonly available and are therefore too costly to have practical uses in heteroepitaxial layer manufacturing. Thus, further improvements in these methods are necessary, and these are now provided by the present invention.

SUMMARY OF THE INVENTION

The present invention now provides a method for manufacturing a wafer that has a non-miscut substrate on which is grown an epitaxial layer of a good quality and of a material that has a different lattice than that of the substrate material. The preferred method is characterized in that growing of the epitaxial layer of the second material is performed before final surface finishing of the substrate.

In particular, the method comprises providing a substrate of a single crystalline first material that has an unfinished or rough surface; and epitaxially growing at least one layer of a second material directly on the unfinished or rough surface of the first material. The second material has a lattice that is different from that of the first material and the epitaxial growing of the second material is advantageously performed before a final surface finishing step on the unfinished or rough surface of the substrate to increase bonding between the materials.

Preferably, the method further comprises forming the substrate from a single crystal ingot of the first material, and treating the substrate surface to increase surface roughness prior to epitaxial growth of the second material thereon. The surface treating includes grinding or lapping the substrate surface, chemically etching the substrate surface, or polishing the substrate surface using chemical-mechanical polishing in a reduced manner. The substrate is preferably an on-axis silicon substrate, such as one having a surface roughness of about 0.15 to about 0.4 nanometers RMS, or having a surface defect density of about 0.2 to about 1 defects of more than 0.12 micrometers in size per square millimeter.

The second material preferably comprises an epitaxially grown graded buffer layer having an exposed surface, wherein the second material is silicon-germanium, gallium arsenide, gallium nitride, or germanium.

Also, a relaxed layer can be epitaxially grown on the exposed surface of the graded buffer layer. The relaxed layer can be provided with an exposed surface that has an increased surface roughness. Generally, a chemical-mechanical polishing stock removal can be performed on the relaxed layer to remove material therefrom. The material thickness removed from the surface of the relaxed layer is about 500 nanometers to several micrometers. Then, the relaxed layer surface can be polished using chemical-mechanical polishing to form a smooth surface on the relaxed layer. This smooth polished surface has a roughness lower than 0.2 nanometers RMS in a 1 by 1 micron scan. Finally, the smooth surface of the relaxed layer is cleaned to remove physical and ionic contamination.

In another embodiment, ionic species can be implanted in the relaxed layer to form a weakened region within the relaxed layer. The method can also include bonding a handle wafer to the relaxed layer to form a bonded structure. Then, a force can be applied to the bonded structure to detach a portion of the relaxed layer and form two structures, wherein one structure comprises the handle wafer and the relaxed layer portion; and the other structure comprises the substrate, the graded buffer layer, and the remaining portion of the relaxed layer, wherein both relaxed layers of the first and second structures have an increased surface roughness. Finally, the relaxed layers can be further epitaxially re-grown on the first and second structures and then can be polished.

The invention also relates to a semiconductor wafer, comprising a substrate of a single crystalline first material that has an unfinished or rough surface, and a graded buffer layer of a second material that is epitaxially grown on the substrate surface, wherein the materials of the substrate and graded buffer layer have different lattices. Preferably, the wafer includes a relaxed layer that is epitaxially grown on the graded buffer layer, wherein the graded buffer layer includes a surface having an increased surface roughness and upon which the relaxed layer is epitaxially grown.

Specific embodiments of the present invention will become more apparent from the following detailed description with reference to the accompanying drawings.

DETAILED DESCRIPTION OF THE PREFERRED EMBODIMENTS

Figure 1:
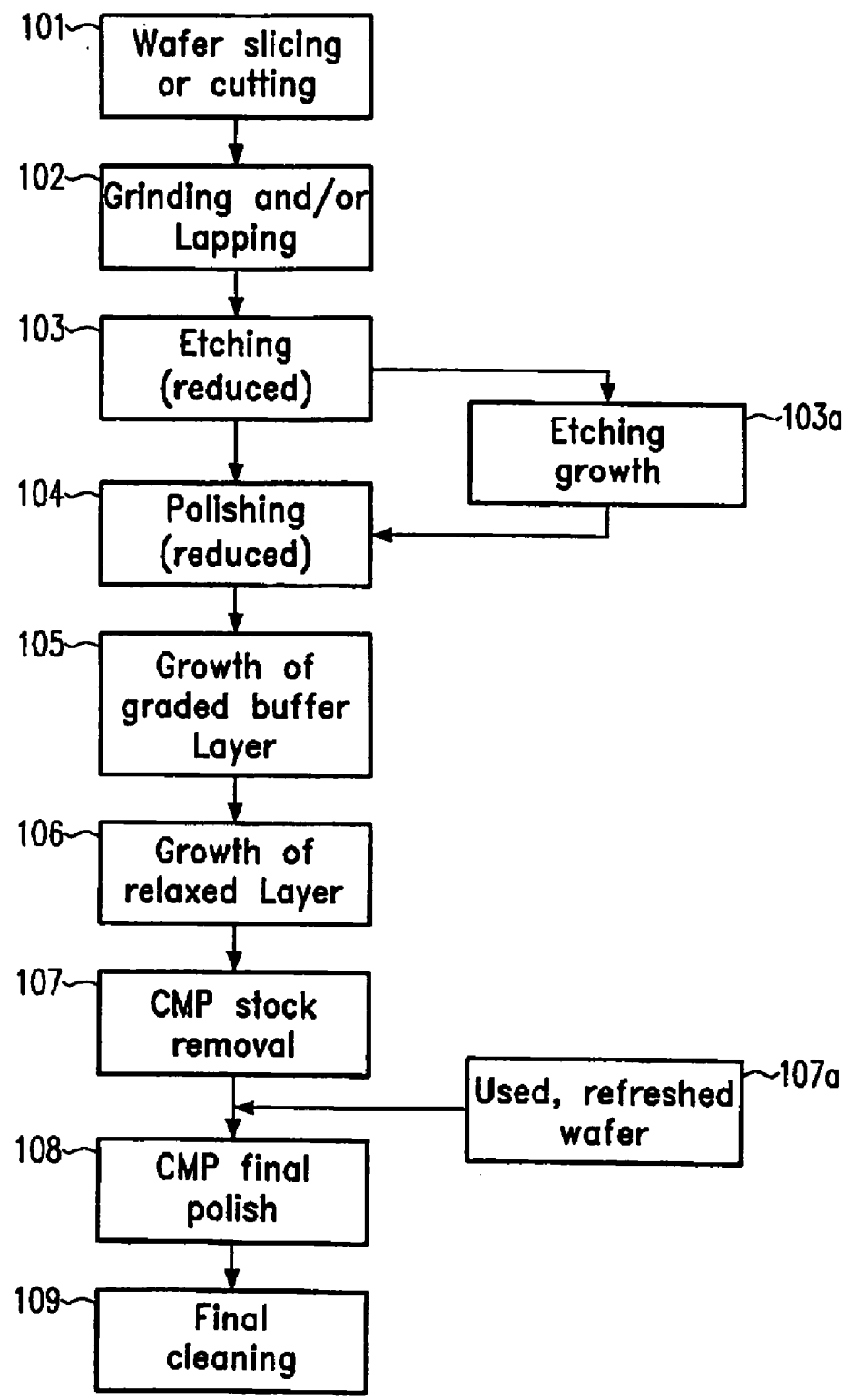
FIG. 1 shows a process sequence according to a first embodiment of the invention.

Surprisingly, the unfinished or rough surface of the substrate before final surface finishing helps to bond first atoms of the second material on the substrate of the first material so that appropriate adhesion properties for the epitaxial layer can be achieved. Therefore, the epitaxial layer can grow right on the substrate of a first material with less stress, resulting in a high quality epitaxial layer of the second material on the substrate of the first material despite the different lattices of these materials. Due to the inventive idea of growing the second material before the final surface finishing step, the added benefit is realized that the process time and cost for the final surface finishing of the substrate can be reduced, leading to a reduction of process time and cost for the heteroepitaxial wafer manufacturing process.

In another embodiment of the invention, the second material is grown before a final step of polishing of the substrate. Surprisingly, the rough surface of the substrate before the final polishing step provides a very good basis for good adhesion and high quality epitaxial growth of the second material on the substrate of the first material. This also allows the reduction of process time and cost of heteroepitaxial wafer manufacturing, but an added benefit is seen in the excellent properties of the wafers that are produced. Thus, the substrate surface should not be subjected to a final polishing step prior to the epitaxial growth of the second material thereon. This enables the surface of the substrate to have a higher roughness or defect density than a mirror-polished surface.

In yet another embodiment of the invention, the second material is grown on an on-axis silicon substrate. Due to this inventive method, conventionally available on-axis, non-miscut substrates can be utilized, making the inventive process very attractive and practical for mass production of heteroepitaxial wafers.

In yet another embodiment of the invention, it is further advantageous to grow the second material on a surface of a substrate which has a higher roughness and/or defect density than a mirror-polished substrate. It has been shown that in spite of the excellent surface quality of a mirror-polished substrate, the second material grows more easily, and with lower stress, on a substrate that has an increased roughness and/or defect density.

In another embodiment of the invention, the second material is epitaxially grown on a substrate having a surface roughness of about 0.15 to about 0.4 nanometers root mean squared ("RMS"). This range of surface roughness is especially effective for a low-stress growth of the second material on the first material.

In another embodiment of the invention, the second material is grown on a substrate having a surface defect density of about 0.2 to about 1 defects with a size of more than 0.12 micrometers per square millimeter. Surprisingly, the defects can be helpful in establishing a better starting layer on which to grow the second material.

Referring to FIG. 1, the preferred method of the first embodiment of the present invention for manufacturing a wafer is schematically shown as a process sequence of steps 101 to 109.

Step 101 includes slicing or cutting a substrate from a single crystal ingot of a first material, resulting in thin slices of substrate 1 of a specific thickness and warpage. The substrate 1 can be sliced, for instance, by using an internal diameter blade or by a wire saw using a fine high-tensile wire as a medium carrying abrasive slurry abrading through an ingot. The slicing or cutting of the substrate 1 can also be performed by any other suitable means generally known in the industry. The ingot and resulting sliced substrate 1 are preferably of a first material of silicon, but can also be of another single crystalline material like germanium, or any other suitable material generally known in the industry.

Figure 2:
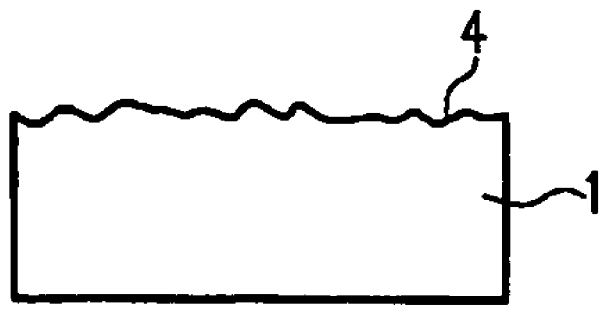
FIG. 2 shows a substrate after being cut from an ingot, ground and/or lapped, and etched and initially polished.

In step 102, at least one substrate 1 of the substrate slices which have been sliced in step 101 is ground and/or lapped. Grinding a substrate 1 can involve, for example, the use of an edge grinding to round-up the edge of the substrate using a diamond-plated wheel which grinds the edge of the sliced or as-cut substrate. The resulting substrate 1 is shown in FIG. 2. The substrate 1 can also be ground by any other suitable means generally known in the industry. Additionally, the substrate 1 can be lapped, for example, between two lapping plates to remove physical irregularities or crystal damage layers left by slicing. Lapping of the substrate 1 can also be performed by any other suitable method known in the industry. Lapping creates a flat surface and uniform thickness of the substrate 1.

Grinding and lapping can be used alternatively. With wafers that are 300 millimeters in size, the substrate 1 is preferably only ground to provide a good flatness of the substrate. With wafers of other sizes, such as 200 millimeter wafers, the substrate 1 is preferably produced by using a lapping step.

In step 103, the lapped or ground substrate 1 is chemically etched. Preferably, etching entails immersing and rotating the substrate 1 in a chemical bath with precisely controlled parameters to remove a layer from the lapped or ground substrate which has been damaged during the grinding or lapping procedures in step 102. Etching of the substrate 1 can also be performed by any other suitable method known in the industry. Besides etching, step 103 further includes cleaning, rinsing, drying, and other suitable operations associated with etching, of the substrate 1. Step 103 of the present invention also includes a more preferable embodiment of reduced alkaline etching so that the surface 4 of the etched substrate 1 can be further damaged. This is in contrast to a damage-free, perfect crystal structure surface which is produced by an etching step of a conventional wafer manufacturing method.

According to another embodiment of the invention, epitaxial growth can be applied, as indicated in step 103*a*, after the etching step 103. In this stage of the process, the surface 4 of the substrate 1 has a better flatness than after double-sided polishing procedures of step 104.

Step 104 is an initial polishing step using chemical-mechanical polishing ("CMP"). In comparison with conventional wafer manufacturing, the initial polishing step 104 is preferably performed in a reduced manner. The result is that the substrate 1 has an increased roughness of the surface 4 after the polishing step 104, as shown in FIG. 2. Preferably, the surface roughness of the substrate after the initial polishing is between about 0.15 and 0.3 nanometers RMS. The surface defect density of the substrate after initial polishing in step 104 is about 0.2 to about 1 defects with a size of more than 0.12 micrometers per square millimeter. This corresponds to a surface defect density for 8 inch and 300 millimeter wafers on the order of 100 defects of a size of more than 0.12 micrometers per wafer. For comparison, the surface defect density of high quality silicon-on-insulator ("SOI") wafers is typically about 25 defects of a size of more than 0.13 micrometers per 8 inch or 300 millimeter wafer.

In a conventional wafer manufacturing process, after etching and initial polishing there would follow another CMP process that may consist of several steps to produce a super-flat mirror surface of the substrate. This surface is microscopically smooth and free from any surface damage or imperfection like scratches, for example, to satisfy the most stringent IC fabrication requirements.

Figure 3:
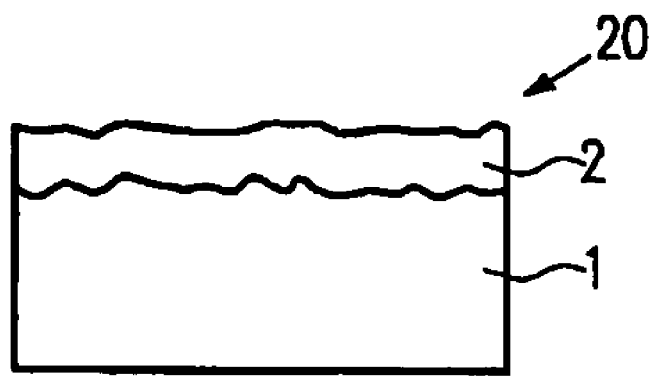
FIG. 3 shows the substrate of FIG. 2 after growth of a graded buffer layer.

In contrast, the present invention includes step 105 where a graded buffer layer 2, which is shown in FIG. 3, is epitaxially grown on the surface 4 of the substrate 1. Defects on, and/or roughness of, the surface 4 form a good basis for a support of bonding of first atoms of the graded buffer layer 2 on the surface 4 of substrate 1. In this way, a start layer of the graded buffer layer 2 can be easily formed while stress in the first atomic layers of the graded buffer layer 2 which contact the surface 4 can be minimized. The unfinished or rough surface 4 of the substrate 1 provides appropriate adhesion properties for the growth of the epitaxial graded buffer layer 2. As another embodiment, the crystal orientation can be slightly off axis to help epitaxial growth. As a result, the substrate 1 forms a very good starting material for high quality epitaxial growth of the graded buffer layer 2. This is a surprising advantage realized by the present invention since conventional wafer manufacturing processes grow high quality layers on high quality substrates that have super-flat and damage-free mirror surfaces.

In a preferred embodiment of the invention, the graded buffer layer 2 is of a second material of SiGe, graded so that the germanium content is gradually increased starting from the surface of the substrate 1 up to about 100% germanium at the surface of the buffer layer. In another embodiment of the invention, the increase in grade of germanium content is less, for example, 20% germanium at the surface of the buffer layer. Any second material which has a lattice that is different from the lattice of the first material of the substrate 1, such as AsGa, GaN, germanium, or any other suitable material generally known in the industry, can be used as a second material for the graded buffer layer 2.

Figure 4:
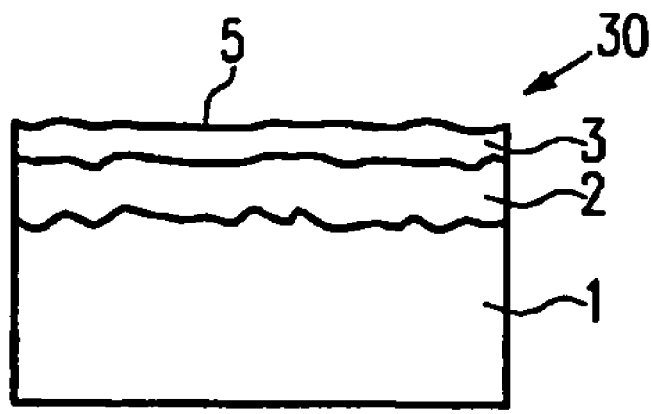
FIG. 4 shows the structure of FIG. 3 after growth of a relaxed layer.

In step 106, a relaxed layer 3 of SiGe, for example, is grown on the surface of graded buffer layer 2, as shown in FIG. 4. The relaxed layer can also be of any other suitable material generally known in the industry. The relaxed layer has a very good crystallinity, but the surface 5 of the relaxed layer 3 also has an increased surface roughness.

In step 107, a CMP stock removal is performed on the relaxed layer 3. This results in the removal of a material thickness of about 500 nanometers to several micrometers from the surface 5 of the relaxed layer 3.

Step 107*a* is another embodiment of the invention where a used wafer (for instance, a donor wafer that remains after transfer of a layer according to SMART CUT® technology, and which has slightly better surface quality than virgin wafers) is refreshed and included in the process just after the CMP stock removal in step 107 and before CMP final polishing in step 108. A process that is commonly employed to refresh a used wafer is exemplarily shown in EP 1156531 A1. Another embodiment of step 107*a* can also include the re-growth of the relaxed layer 3.

In step 108, a final polishing of the relaxed layer 3 using CMP forms a surface 8 of the relaxed layer 3 with a roughness lower than 0.2 nanometers RMS in a 1 by 1 micron scan.

Figure 5:
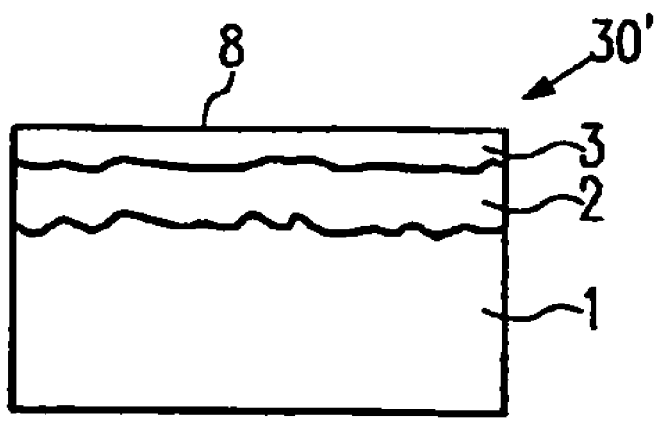
FIG. 5 shows the structure of FIG. 4 after CMP stock removal and surface finishing.

In step 109, physical and ionic contamination of microscopic particles and metallic/non-metallic residues, for example, are removed to create a very smooth surface 8, as shown in FIG. 5.

FIG. 2 shows the substrate 1 after step 104, where the as-ground or as-lapped substrate is treated with reduced etching and initial polishing of steps 103 and 104. The surface 4 of the substrate 1 has an increased roughness and an increased surface defect density.

FIG. 3 shows the substrate 1 of FIG. 2 after step 105, where the graded buffer layer 2 is epitaxially grown on the surface 4 of the substrate 1 forming structure 20. The second material of the graded buffer layer 2 is different in lattice from the first material of the substrate 1. Despite the rough and defect-containing surface 4 of the substrate 1, the graded buffer layer 2 forms with a very good crystallinity and with nearly no defects.

FIG. 4 shows the structure 20 of FIG. 3 after step 106, which results in the forming of structure 30. In step 106, the relaxed layer 3 is grown epitaxially and with very good crystallinity on the graded buffer layer 2. The surface 5 of the relaxed layer 3 has an increased surface roughness.

FIG. 5 shows the structure 30 of FIG. 4 after steps 107, 108 and 109 are applied. The resulting structure 30' has a flat and smooth surface 8.

Figure 6:
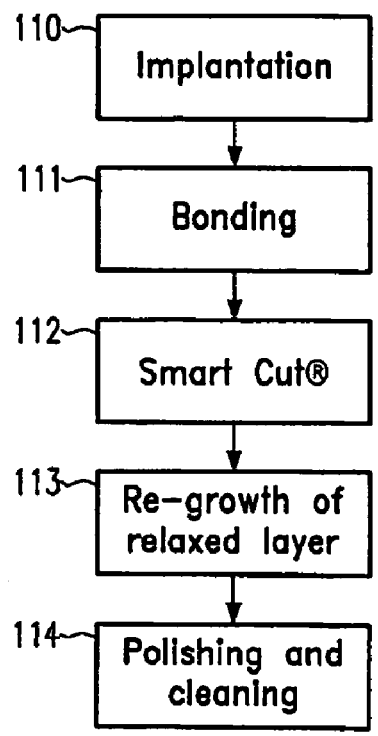
FIG. 6 shows a method according to a second embodiment of the present invention.
Figure 7:
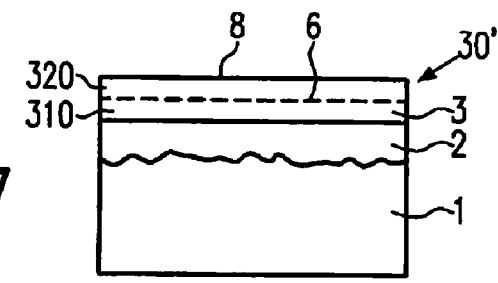
FIG. 7 shows the structure of FIG. 5 after implantation of an ionic species in the relaxed layer.

FIG. 6 shows a preferred method of the second embodiment of the present invention which is a process sequence of steps 110 to 114, which follow the steps 101 to 109 of FIG. 1. Step 110 includes the implantation of ionic species in the relaxed layer 3 of the structure 30'. This forms a weakened region 6 in the relaxed layer 3, as shown in FIG. 7. The weakened region 6 divides the relaxed layer 3 into two relaxed layer portions 310, 320.

Figure 8:
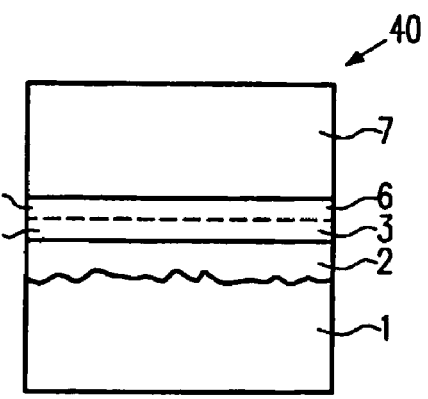
FIG. 8 shows the structure of FIG. 7 after bonding of a handle wafer to the surface of the relaxed layer.

Step 111 includes the bonding of the structure 30' with a handle wafer 7, such as a silicon wafer. The handle wafer 7 can be of any other suitable material generally known in the industry. Bonding is performed between a mirror-flat surface of the handle wafer 7 and the polished and smooth surface 8 of the relaxed layer 3 of structure 30'. The resulting bonded structure 40 is shown in FIG. 8.

In step 112, which is a "SMART-CUT® process" step, a certain amount of energy, for example mechanical, thermal, acoustical or optical energy, is applied to the side of the bonded structure 40 at the weakened region 6. This results in the splitting of the bonded structure 40 into two structures, which are shown as structures 50, 60 in FIGS. 9 and 12 respectively.

The top of the structures 50, 60 consist of, respectively, relaxed layer portions 320, 310. Due to the splitting, the as-cut surfaces 9, 12 of the structures 50, 60 have an increased surface roughness.

Figure 10:
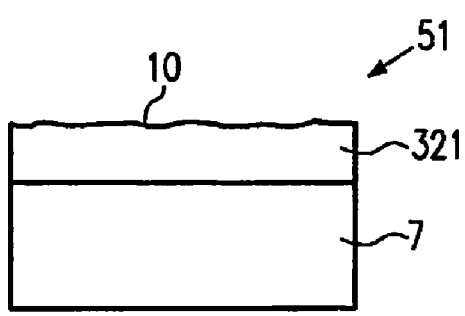
FIG. 10 shows the structure of FIG. 9 after re-growth of the relaxed layer portion.
Figure 13:
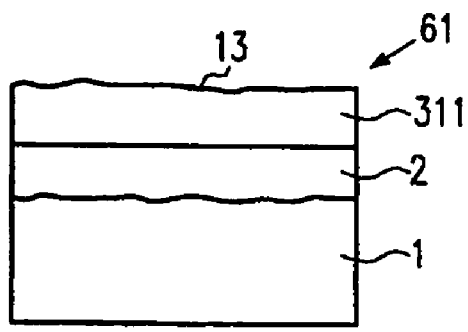
FIG. 13 shows the structure of FIG. 12 after re-growth of the relaxed layer portion.

In step 113, the relaxed layer portions 320, 310 of structures 50, 60 are re-grown to a greater thickness resulting in structures 51, 61 with thicker relaxed layer portions 321, 311. In step 114, the surfaces 10, 13 of the structures 51, 61 in FIGS. 10 and 13 are polished with a CMP process and cleaned thereafter, resulting in smooth and nearly defect-free surfaces 11, 14 of structures 52, 62 shown, respectively, in FIGS. 11 and 14.

FIG. 7 shows the structure 30' of FIG. 5 after the implantation of ionic species during step 110, resulting in the structure 30' with the weakened region 6 in the relaxed layer 3.

FIG. 8 shows the structure 30' of FIG. 7 after the bonding of step 111 where the structure 30' has been bonded together with the handle wafer 7 resulting in the bonded structure 40.

Figure 9:
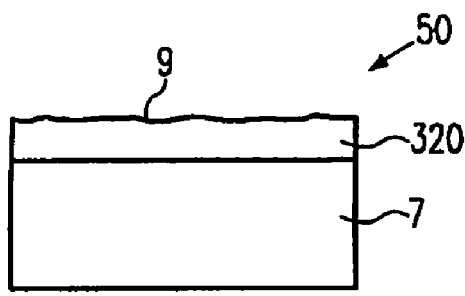
FIG. 9 shows the first as-cut part of the structure of FIG. 8 after applying a force to the weakened region of the relaxed layer.
Figure 12:
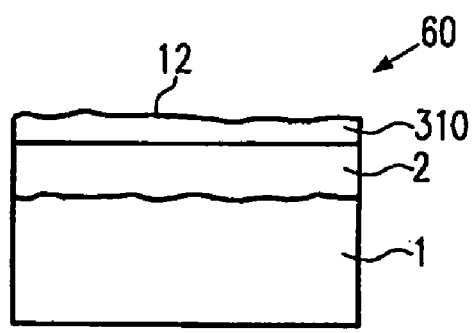
FIG. 12 shows the second as-cut part of the structure of FIG. 8 after applying a force to the weakened region of the relaxed layer.

FIGS. 9 and 12 show parts of the bonded structure 40 of FIG. 8 after splitting during step 112. During the splitting step 112, the bonded structure 40 splits along the weakened region 6 which forms a predetermined splitting line. The surfaces 9, 12 of structures 50, 60 are produced after the splitting step 112 and are therefore relatively rough. The wafer 50 consists of the handle wafer 7 and the relaxed layer portion 320 of the former relaxed layer 3. The wafer 60 consists of the substrate 1, the graded buffer layer 2 and the relaxed layer portion 310 of the former relaxed layer 3.

FIGS. 10 and 13 show the structures 50, 60 of FIGS. 9 and 12 after a re-growth of the relaxed layer portions 320, 310 up to the thicker relaxed layer portions 321, 311.

Figure 11:
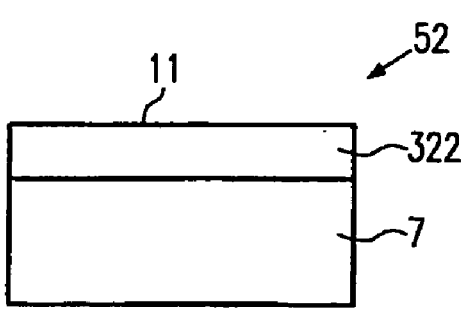
FIG. 11 shows the structure of FIG. 10 after surface finishing of the re-grown relaxed layer portion.
Figure 14:
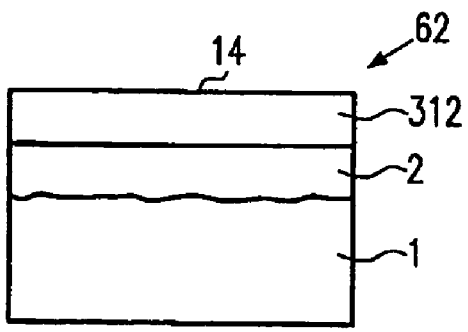
FIG. 14 shows the structure of FIG. 13 after surface finishing of the re-grown relaxed layer portion.

FIGS. 11 and 14 show the structures 51, 61 of FIGS. 10 and 13 after polishing and cleaning during step 114, resulting in the flat and nearly defect-free surfaces 11, 14 of the final structures 52, 62.

With regard to all process steps shown in FIGS. 1 and 6, it should be noted that the steps only represent characteristic steps of the complete process flow and do not claim to be the only steps which can be used. Between the steps identified, further steps such as cleaning, handling, annealing and layer deposition steps can be applied, as well as any other suitable steps generally known in the industry. A non-graded layer can also be epitaxially grown on the substrate 1 instead of the graded buffer layer 2, but it should be noted that the grown layer, whatever its material, should be of a material other than the material of the substrate 1.

In all possible process flow schemes, the epitaxial growth of the layer on the substrate 1 is performed on an unfinished substrate which differs, in regard to its surface quality, from conventionally available substrates that have mirror-polished surfaces.

While illustrative embodiments of the invention are disclosed herein, it will be appreciated that numerous modifications and other embodiments may be devised by those skilled in the art. Therefore, it is understood that the appended claims are intended to cover all such modifications and the embodiments that come within the spirit and scope of the present invention.

What is claimed is:

1. A method of manufacturing a wafer which comprises; providing a substrate of a single crystalline first material that has an unfinished or rough surface; and
epitaxially growing at least one layer of a second material directly on the unfinished or rough surface of the first material,
wherein the second material has a lattice that is different from that of the first material, and the epitaxial growing of the second material is performed before a final surface finishing step on the unfinished or rough surface of the substrate, wherein the substrate surface has a surface roughness of about 0.15 to about 0.4 nanometers RMS.

2. The method of claim 1, wherein the substrate is an on-axis silicon substrate.

3. The method of claim 1, wherein the substrate is formed from a single crystal ingot of the first material.

4. The method of claim 1, wherein the substrate surface has a surface defect density of about 0.2 to about 1 defects of more than 0.12 micrometers in size per square millimeter.

5. A method of manufacturing a wafer which comprises:
forming a substrate of a single crystalline first material from a single crystal ingot of the first material;
treating the substrate surface to increase surface roughness prior to epitaxial growth of a second material thereon; and
epitaxially growing at least one layer of a second material directly on the unfinished or rough surface of the first material;
wherein the second material has a lattice that is different from that of the first material, and the epitaxial growing of the second material is performed before a final surface finishing step on the unfinished or rough surface of the substrate.

6. The method of claim 5, wherein the surface treating includes:
grinding or lapping the substrate surface;
chemically etching the substrate surface; or
polishing the substrate surface using chemical-mechanical polishing in a reduced manner.

7. The method of claim 1, wherein the second material comprises an epitaxially grown graded buffer layer having an exposed surface.

8. The method of claim 7, which further comprises epitaxially growing a relaxed layer on the exposed surface of the graded buffer layer.

9. The method of claim 8, which further comprises providing the relaxed layer with an exposed surface that has an increased surface roughness.

10. The method of claim 9, which further comprises performing a chemical-mechanical polishing stock removal on the surface of the relaxed layer to remove material therefrom.

11. The method of claim 10, wherein the material thickness removed from the surface of the relaxed layer is about 500 nanometers to several micrometers.

12. The method of claim 10, which further comprises polishing the relaxed layer surface using chemical-mechanical polishing to form a smooth surface on the relaxed layer.

13. The method of claim 12, wherein the relaxed layer after final chemical-mechanical polishing has a polished surface with a roughness lower than 0.2 nanometers RMS in a 1 by 1 micron scan.

14. The method of claim 12, which further comprises cleaning the smooth surface of the relaxed layer to remove physical and ionic contamination.

15. The method of claim 8, which further comprises implanting ionic species in the relaxed layer to form a weakened region within the relaxed layer.

16. The method of claim 15, which further comprises bonding a handle wafer to the relaxed layer to form a bonded structure.

17. The method of claim 16, which further comprises applying a force to the bonded structure to detach a portion of the relaxed layer and form two structures, wherein:
 the first structure comprises the handle wafer and a portion of the relaxed layer; and
 the second structure comprises the substrate, the graded buffer layer, and the remaining portion of the relaxed layer, wherein both relaxed layer portions of the first and second structures have an increased surface roughness.

18. The method of claim 17, which further comprises epitaxially re-growing the relaxed layers on the first and second structures.

19. The method of claim 18, which further comprises polishing the surfaces of the re-grown relaxed layers of the first and second structures.

20. The method of claim 1, wherein the second material is silicon-germanium, gallium arsenide, gallium nitride, or germanium.

21. A semiconductor wafer, comprising:
 a substrate of a single crystalline first material that has an unfinished or rough surface; and
 a graded buffer layer of a second material that is epitaxially grown on the substrate surface,
 wherein the materials of the substrate and graded buffer layer have different lattices and the substrate surface has a surface roughness of about 0.15 to about 0.4 nanometers RMS.

22. The semiconductor wafer of claim 21, further comprising a relaxed layer that is epitaxially grown on the graded buffer layer, wherein the graded buffer layer includes a surface having an increased surface roughness and upon which the relaxed layer is epitaxially grown.

* * * * *